United States Patent [19]

Komatsu et al.

[11] 4,068,090

[45] Jan. 10, 1978

[54] HEARING AID

[75] Inventors: Hidetoshi Komatsu; Mutsuto Tezuka; Shinji Morozumi, all of Suwa, Japan

[73] Assignee: Kabushiki Kaisha Suwa Seikosha, Tokyo, Japan

[21] Appl. No.: 701,843

[22] Filed: July 1, 1976

[30] Foreign Application Priority Data

July 1, 1975 Japan ................................ 50-81559

[51] Int. Cl.$^2$ ...................... H04R 3/00; H04R 25/00; H03F 3/16
[52] U.S. Cl. .............................. 179/1 A; 179/107 R; 330/277; 330/307
[58] Field of Search ................... 179/1 A, 1 F, 107 R, 179/107 E

[56] References Cited

U.S. PATENT DOCUMENTS 3,624,315  11/1971  Broce et al. .................... 179/1 A
3,728,496  4/1973  Page ............................. 179/1 A
3,862,367  1/1975  Kono et al. ..................... 179/1 A Primary Examiner—George G. Stellar
Attorney, Agent, or Firm—Blum, Moscovitz, Friedman & Kaplan

[57] ABSTRACT

An improved hearing aid utilizing integrated field-effect transistors to reduce the size and power consumption thereof is provided. The hearing aid includes a microphone input device for producing signals representative of sound, an amplifier circuit for amplifying the signals produced by microphone input device, and a loudspeaker output device for producing sound representative of the sound sensed by the microphone input device at an amplified level. The invention is particularly characterized by a portion of at least the microphone input device, amplifier circuit and/or microphone output device being formed of MOS field-effect transistors.

22 Claims, 22 Drawing Figures

HEARING AID

BACKGROUND OF THE INVENTION

This invention is directed to reducing the size and current consumption of a battery-operated hearing aid, and in particular to utilizing field-effect MOS transistors to synthesize the circuitry of a hearing aid.

Heretofore, the circuits in a hearing aid, and in particular the amplifier thereof have been formed with bi-polar transistors operating in class A amplification mode, the respective bi-polar transistors being formed on a printed circuit board. One characteristic of class A transistor operation is that output current flows at all times and thereby rapidly exhausts the battery life. Many hearing aids presently on the market require the button-shaped battery utilized to energize same to be replaced every three days. Additionally, forming the amplifier circuit on a printed circuit board requires leads for coupling the amplification circuitry to the microphone and loudspeaker, which clearly lessens the reliability of the hearing aid and introduces noise into the signals amplified thereby.

SUMMARY OF THE INVENTION

Generally speaking, in accordance with the instant invention, a hearing aid formed of field-effect MOS transistors is provided. The hearing aid includes a first transducer for producing signals representative of sound sensed thereby, an amplifier circuit for amplifying the signals representative of sound produced by the first transducer, and a second transducer for receiving the amplified signals and producing sound representative of the sound sensed by the first transducer at an amplified level. The invention is characterized by at least the amplifier circuitry being formed of field-effect MOS transistors for reducing the power consumption and increasing the reliability of the hearing aid.

Accordingly, it is an object of the instant invention to increase the life of a battery utilized to power the circuitry of a hearing aid by sharply reducing the power consumption of the hearing aid circuitry.

Another object of the instant invention is to utilize field-effect MOS transistors to synthesize the amplifier circuit in a hearing aid.

A further object of the instant invention is to provide a more reliable miniaturized hearing aid wherein the circuit design avoids the introduction of noise signals therein.

Still a further object of the instant invention is to provide an improved small-sized and inexpensive hearing aid by integrating the circuitry thereof into a single circuit chip.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1A:
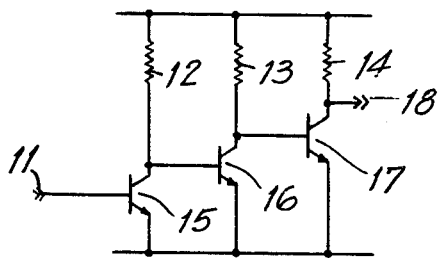
FIG. 1A is a circuit diagram of a hearing aid amplifier circuit constructed in accordance with the prior art.
Figure 1B:
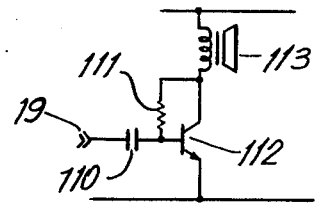
FIG. 1B is a circuit diagram of a hearing aid earphone loudspeaker driving circuit constructed in accordance with the prior art.
Figure 2:
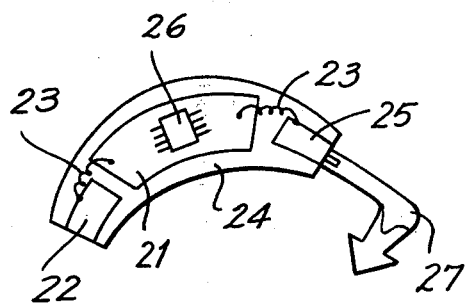
FIG. 2 is an elevational view of a hearing aid constructed in accordance with the prior art.

Referring initially to FIG. 1A, 1B and FIG. 2, an amplifier circuit, earphone driving circuit and hearing aid constructed in accordance with the prior art are respectively depicted. As is specifically illustrated in FIG. 1A, the amplifier circuit includes resistors 12, 13 and 14 respectively coupled to the collector electrodes of bi-polar transistors 15, 16 and 17, which transistors are cascaded to define an input terminal 11 at the base electrode of bi-polar transistor 15, and an output terminal 18 at the collector electrode of bi-polar transistor 17. A characteristic of the bi-polar transistors 15, 16 and 17 is that same operate in a class A amplification mode thereby cuasing excessive current consumption since current flows at all times, thereby rapidly exhausting the life of a battery energizing same. In order to reduce the collector current, it is necessary to reduce the ratio of current amplification. Such reduction results in a like reduction in the gain of the amplifier circuit, which reduction in the gain is further accompanied by, among other difficulties, a deterioration in the temperature characteristic of the amplifier circuit and a reduced efficiency in response to the increase in the base biasing current.

The earphone driving circuit depicted in FIG. 1B also operates in a class A amplification mode and includes input terminal 19 coupled through base capacitor 110 to the base electrode of bi-polar transistor 112. A bias resistor 111 is coupled between the collector electrode and base electrode of the bi-polar transistor 112, and the collector electrode of bi-polar transistor 112 is coupled to the earphone 113 to thereby drive same. The current consumption of the earphone drive circuit illustrated in FIG. 1B is inefficient and contributes to a button-shaped battery having to be replaced as often as once every three days.

As is illustrated in FIG. 2, the hearing aid includes a case 24 supporting a printed circuit board 21 coupled through connecting cables 23 to a microphone 22 and to a loudspeaker 25. The printed circuit board 21 includes an IC 26 and an earplug 27 is mounted to the case 24 for securing the hearing aid to the user's ear. In prior art hearing aids, the printed circuit board is spaced apart from the microphone 22 and loudspeaker 25 and is therefore coupled thereto by cables 23, which cables introduce noise into the amplified signal and lessen the reliability of the hearing aid.

The instant invention is directed to an improved hearing aid, wherein power consumption is reduced by utilizing field-effect MOS transistors, also referred to herein as MOSFETs, for synthesizing a portion of, or the entire amplifier circuit, to thereby reduce the power consumption of the amplifier circuit and hence effect a sharp increase in the life of the battery utilized to energize the hearing aid circuitry. Moreover, by combining the amplifier circuit and microphone input device into a single integrated circuit chip, a miniaturized and highly reliable hearing aid circuit wherein no noise is introduced results.

Figure 3:
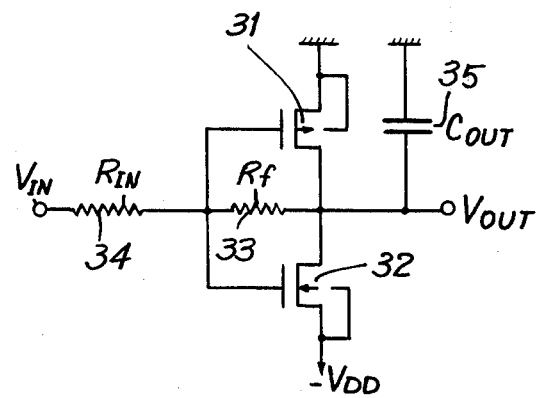
FIG. 3 is a detailed circuit diagram of a C-MOS inverter-amplifier circuit of the type utilized in the instant invention.
Figure 4:
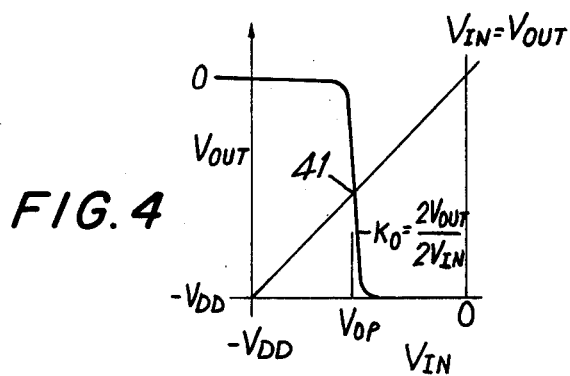
FIG. 4 is a graphical illustration of the operation of the C-MOS inverter-amplifier circuit illustrated in FIG. 3.

Reference is now made to FIG. 3, wherein a C-MOS inverter-amplifier circuit of the type utilized in the instant invention is depicted. The C-MOS inverter-amplifier circuit includes a complementary coupled P-channel MOSFET 31 and an N-channel MOSFET 32, the respective MOSFETs 31 and 32 having commonly coupled drain electrodes defining an output and commonly coupled gate electrodes defining an input. A feedback resistor 33 ($R_f$) is coupled between the drain output and gate input, and a further resistor 34 ($R_{in}$) is coupled to the drain input. The output $V_{out}$ includes output capacitance 35 ($C_{out}$) between the gate output and ground. As illustrated in FIG. 4, the C-MOS inverter-amplifier circuit is particularly characterized by having good linearity and high gain over a wide range of output amplification. It is noted that the frequency characteristic is determined by the capacitance 35 and the output impedance of the C-MOS inverter-amplifier.

The output impedance of the C-MOS inverter-amplifier is determined by the construction of the MOSFET's used to form same. When the output impedance is of a high order of magnitude, current comsumption $i_D$ is substantially reduced. For example, if $C_{out}$ = 10pF and $f_h$ = 10KHz (where $f_h$ is the cut-off frequency on the high frequency side), $i_D$ is 5uA or less, and the open loop gain of the circuit $K_D$ is 40 dB or greater. The principal behind the reduced power consumption obtaining to the C-MOS inverter-amplifier circuit is that the P-channel MOSFET 31 and N-channel MOSFET 32 are complementary coupled. Thus, when the input voltage $V_{in}$ is not at the operating point voltage $V_{op}$ (point 41 of FIG. 4), the impedance of one of the MOSFETs becomes extremely large, thereby minimizing the current flowing therein. Further, the input impedance of the circuit is so high that the circuit is essentially voltage sensitive with negligible current flow even during operation. Thus, the closed loop gain of the C-MOS inverter-amplifier circuit is $$K_i = K_O \times (R_f/R_{in})$$

Thus, the gain of a C-MOS amplifier-inverter is determined by the impedances thereof, when the transistors forming same are in a saturation state, and the longer the length L of the channel, the higher is the gain of the circuit.

In general, if the output impedance of the C-MOS inverter-amplifier is large, the input resistance $R_{in}$ must be even larger than the output impedance in order for the circuit to operate in an amplification mode. Accordingly, the input resistance $R_{in}$ and the feedback resistance $R_f$ are usually provided with a large magnitude. Accordingly, when a large output and input resistance is required, and it is desired to integrate the MOSFETs in an integrated circuit chip to form the C-MOS inverter-amplifier circuit, the input and output impedances are preferably defined by complementary coupled MOS transistors of the type depicted in FIG. 5, which MOSFETs define an equivalent resistance.

Figure 5:
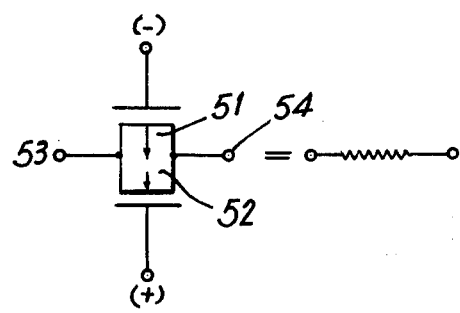
FIG. 5 is a circuit diagram illustrating complementary coupled MOS transistors forming an equivalent resistance element of the type utilized in the instant invention.

Referring specifically to FIG. 5, the respective source and drain electrodes of a P-channel MOSFET 51 are respectively coupled to the source and drain electrodes of a N-channel MOSFET 52 in order to define an input terminal 53 and output terminal 54. By coupling the respective gate electrodes of the P-channel MOSFET and N-channel MOSFET across the power signal, an equivalent MOS resistance is provided. Moreover, when a high MOS resistance is needed, a reduction in the size-ratio W/L of the field-effect transistor channel can be effected (the size-ratio being the size-ratio of the channel width and length of the MOSFET). Accordingly, when MOS resistors are utilized to define the input resistance $R_{in}$ and feedback resistance $R_f$, the closed loop gain $K_i$ of the inverter-amplifier circuit is determined solely by the size-ratio W/L of the MOSFETs and the variations in the threshold voltages of the MOSFETs can be ignored. Moreover, carrier shifts which vary by manufacturer and time of manufacturing are rendered insignificant. When the gate voltage applied to the MOSFET is larger than the voltage of the input terminals 53 and 54, and threshold voltages of the MOSFETs is small or at least do not have large amplitude signals applied thereto, a large impedance and hence a stable gain is obtained.

Figure 6:
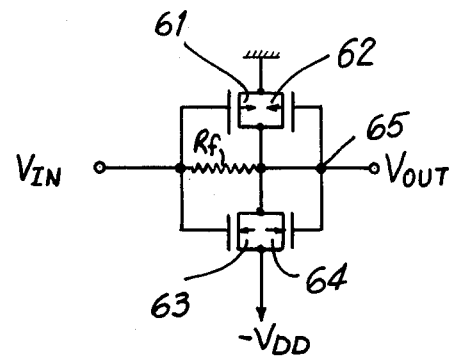
FIGS. 6, 7 and 8 are detailed circuit diagrams of C-MOS inverter-amplifiers including feedback circuitry of the type utilized in the instant invention.

Reference is now made to FIG. 6, wherein a C-MOS inverter-amplifier circuit utilizing MOS transistors as resistance elements is depicted. P-channel transistor 61 is coupled to P-channel feedback transistor 62 and N-channel transistor 63 is coupled to N-channel feedback transistor 64. Accordingly, feedback MOS transistors 62 and 64 are loads and the gain of the C-MOS inverter-amplifier circuit is determined by the ratio of the impedances of the amplifier MOSFETs 61 and 63 and feedback MOSFETs 62 and 64. Accordingly, the gain is dependent on the size-ratio of the respective transistors 61 through 64 defining the C-MOS inverter-amplifier circuit and thereby provides a highly stable circuit.

Figure 7:
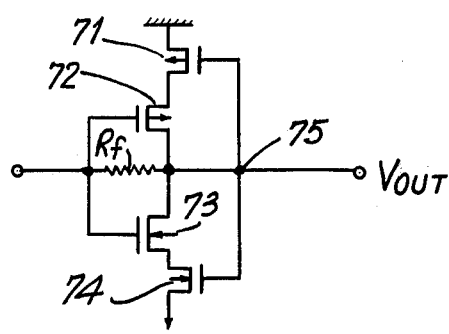

Referring now to FIG. 7, the C-MOS inverter-amplifier circuit includes P-channel MOSFET 72 and N-channel MOSFET 73, which MOSFETs function as amplification transistors, and further includes P-channel feedback MOSFET 71 coupled in series with MOSFET 72 and N-channel feedback MOSFET 74 coupled in series with MOSFET 73. Like the circuit in FIG. 6, these feedback circuits can be eliminated when the gain is not high and they are being utilized to convert the impedance.

Figure 8:
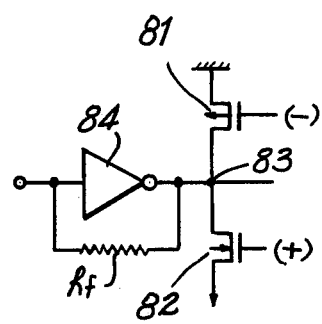

Referring now to FIG. 8, a C-MOS inverter-amplifier circuit, wherein a load is inserted at the drain output 83 so that the gain is determined by the impedance of the load defined by P-channel transistor 81 and N-channel transistor 82 and the impedance of the inverter 84, is provided. In the MOSFETs of the inverter-amplifier circuits illustrated in FIGS. 6 to 8, each of the P-channel and N-channel transistors could be replaced by impedance loads. Additionally, either the P-channel feedback transistor or N-channel feedback transistor can be eliminated.

Figure 9:
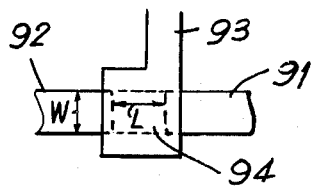
FIG. 9 is a plan view of an insulated gate field-effect transistor of the type utilized in the hearing aid circuitry of the instant invention.

The MOSFETs of the instant invention are formed in the manner depicted in FIG. 9 so that the channel 94 is disposed between the source region 91 and the drain region 92. A gate electrode 93 overlays a thin insulating film and defines the channel 94 between the respective source and drain regions. The equivalent impedance $R_{tr}$ is inversely proportional to the size-ratio W/L. For example, when W is on the order of $10\mu$, and L is on the order of $1,000\mu$, a large resistance within a range of 10 to 100 M $\Omega$ is obtained. Thus, when the resistors $R_{in}$ and $R_f$ are MOS resistors, in the circuit illustrated in FIG. 3, assuming that $W_{Rin} = W_{Rf}$ and $L_{Rf}/L_{Rin} = 10$, a closed loop gain on the order of 10 is obtainable. Since the remaining circuits have substantially zero variation, stable operation of the circuit is obtained. It is noted that the advantage obtained by utilizing MOS transistors to form an equivalent resistance is that the gain is automatically controlled by the large feedback effect which results in lowering the equivalent resistance when there are large changes in the amplitude of the signal applied on the respective sides of the resistance, an advantage that is not obtained by feedback resistors in the prior art amplifier circuit. Moreover, as is detailed below, when MOS resistors are utilized as feedback resistors in multi-stage amplifier circuits in accordance with the teachings of the instant invention, further stabilization of the operation of the amplifier circuit is effected.

It is noted however, that when the output of an electric charge microphone or capacity variation microphone of the electret film type or the like is amplified, and the aforementioned MOS resistor feedback amplifier is utilized, the feedback resistance lowers the input impedance, thereby causing a mismatching of the respective impedances, hence lowering the gain of the circuit. In such event, the gain stability is maintained by eliminating the feedback resistance.

Figure 10:
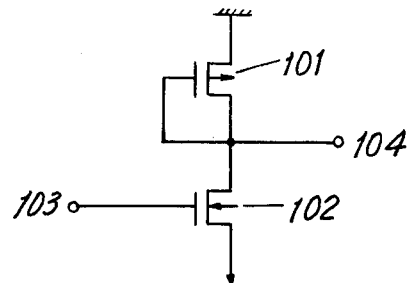
FIGS. 10 and 11 are circuit diagrams of field-effect MOS transistor amplifier input circuits of the type utilized in the instant invention.
Figure 11:
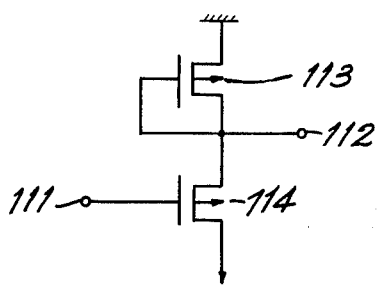

Referring specifically to FIG. 10, a inverter-amplifier circuit wherein the closed loop gain $K_i$ is not related to the values of the threshold voltage of the P-channel MOSFET 101 and N-channel MOSFET 102 is depicted. Instead, the gain $K_i$ is determined by the formula $$K_i = \sqrt{\beta P/\beta N}$$

where $\beta = \mu$ for a specific $C_{ox}$ W/L, where $\mu$ is carrier shift, and $C_{ox}$ is the capacitance corresponding to the unit area of the gate region. This same effect can be obtained if the P-channel MOSFET and N-channel MOSFET are reversed. Moreover, as is illustrated in FIG. 11, the MOSFETs can both be P-channel MOSFETs or N-channels MOSFETs. When the gain is limited to the value 1, it is more advantageous to use a source circuit or follower circuit of the type depicted in FIG. 12.

Figure 12:
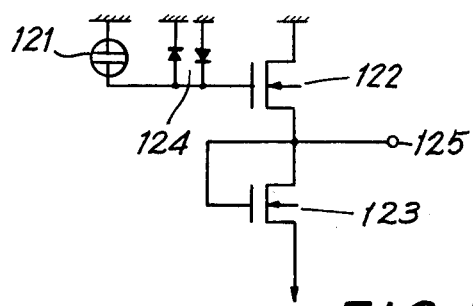
FIG. 12 is a detailed circuit diagram of an electret capacitor microphone input circuit constructed in accordance with a preferred embodiment of the instant invention.

As is illustrated in FIG. 12, diode array 124 is utilized as a load for the electret capacitor microphone 121. The array consists of two diodes disposed in parallel with one in the forward biased direction and the other in reverse biased direction and also serve to protect the gate of the N-channel transistor 122. With this construction, the load resistance $R_M$ is given the following formula $$1/R_M = I/\delta V/\delta V = 0 = (q/K_f)(J_{01} + J_{02})$$

wherein $J_{01}$ and $J_{02}$, respectively refer to the saturation voltages of the transistors and can be selected to a suitable value to provide a resistance on the order of $10^8$ to $10^9$ $\Omega$. Thus, if N-channel MOSFET 123 has a higher impedance than MOSFET 122, by converting the impedance, the output of the microphone is applied to the output terminal 125. Accordingly, the electret capacitor microphone, hereinafter referred to as "ECM", provides signals representative of the sound sensed thereby to the output terminal 125. Accordingly, the ECM input circuit depicted in FIG. 12, when incorporated into a hearing aid eliminates the need for a connecting capacitor, which capacitor is often required in a conventional type input circuit. Moreover, it is noted that the gate potential of the MOSFETs 101, 113 and 123 utilized as loads in FIGS. 10, 11 and 12 respectively can be a power source potential, a feedback potential from an output point or a source potential (if the transistor is a depletion type transistor).

Figure 13:
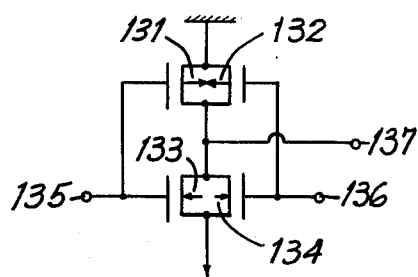
FIGS. 13 and 14 are detailed circuit diagrams of mixing circuits constructed in accordance with the instant invention.
Figure 14:
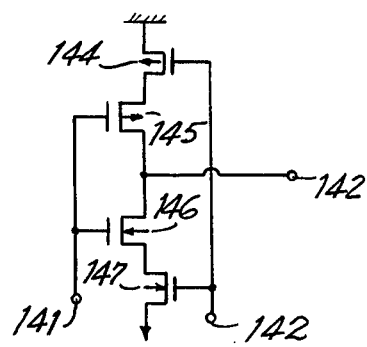

Reference is now made to FIG. 13, wherein a mixing circuit for receiving input signals from two microphones and mixing same is depicted. Two complementary coupled pairs of P-channel N-channel MOS transistors 131 and 132 and 133 and 134 are coupled by their respective source regions to define a common output 137, and P-channel transistor 131 and N-channel transistor 133 have the gate electrodes thereof commonly coupled to define a first input 135, while the P-channel transistor 132 and N-channel transistor 134 have their respective gate electrodes coupled to define a second input 137. The mixing ratio of the signal is determined by the ratio of size of MOSFETs or is determined in accordance with feedback ratio and size-ratio ($\beta$). It is noted that the mixing circuit illustrated in FIG. 13 can be inserted in series or coupled on the side of the load in the input circuits illustrated in FIGS. 10, 11 and 12. Referring also to FIG. 14, a further mixer circuit is illustrated. The commonly coupled gate electrodes of P-channel transistor 145 and N-channel transistor 146 define a first input 141. A second P-channel transistor 144 is coupled in series with N-channel transistor 145 and a second N-channel transistor 147 is coupled in series with N-channel transistor 146, with respective gate electrodes of the second transistors 144 and 147 defining a second input 142. The commonly coupled drain output terminals of the N-channel transistors 145 and 146 define the common output 142 and produce the same mixing result obtained in the circuit depicted in FIG. 13 and additionally, is readily utilized with the ECM input circuits illustrated in FIGS. 10, 11 and 12.

The principal advantage which obtains to the aforedescribed amplifier embodiments is the clear reduction in the current consumption thereof. The reason for such reduction is that voltage driving rather than current driving is utilized. Thus, it is only necessary to provide a sufficient current flow to charge and discharge the output capacitance $C_{out}$ on the output side of the inverter-amplifier which results from the cut-off frequency. For example, assuming $C_{out} = 10^{PF}$ and a cutoff-frequency at $-3^{dB}$ of 10 KHz, the output impedance $R_{out}$ is computed by the following formula $$R_{out} = 1/(10^4 \times 2\pi \times 10^{-1}) = 1.6 \, M\Omega$$

Thus, an operating point current on the order of several μA is sufficient to provide an output impedance on the order of 1.6 MΩ. When an amplifier for amplifying sound signals is comprised of MOSFETs, one difficulty arises when a low impedence load such as a dynamic type loudspeaker is coupled to the output thereof. In comparison with conventional bi-polar type transistors, the MOSFETs have a high impedance and because voltage driving rather than current driving is effected, the low power which inures to class B push-pull amplifiers of the C-MOS variety are insufficient to drive the loudspeaker load.

Figure 15:
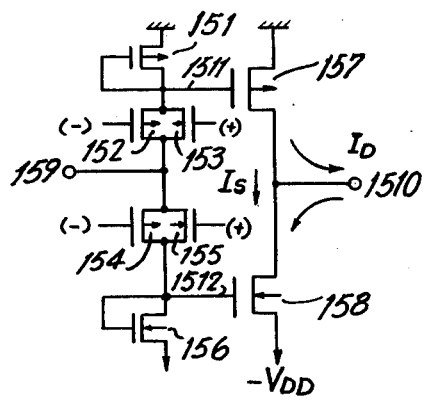
FIG. 15 is a detailed circuit diagram of a C-MOS class B amplifier circuit constructed in accordance with the instant invention.

The instant invention is directed to avoiding this difficulty by lowering the current consumption at the time that no signal is transmitted so that for purposes of measurement, the current load, when no signal is amplified, is negligible. Accordingly, reference is made to FIG. 15, wherein a circuit for coupling the output of the C-MOS inverter to a low impedance loudspeaker or earphone is depicted. The connecting circuit is adapted to provide class B operation and includes the drain electrode of P-channel transistor 152 being coupled to the drain electrode of P-channel transistor 154 to define an input terminal 159 thereby. The drain and source electrodes of P-channel transistors 152 and 154 are respectively coupled to the source and drain electrodes of N-channel transistors 153 and 155. The commonly coupled source terminals of P-channel transistor 152 and N-channel transistor 153 are coupled to the source and gate electrodes of P-channel transistor 151 to define a gate driving input to P-channel drive transistor 157. Similarly, the commonly coupled source electrodes of P-channel transistor 154 and N-channel transistor 155 are coupled to the source and gate electrodes of N-channel transistor 156 to define gate driving input 1512 of N-channel drive transistor 158. The respective drain electrodes of drive transistors 157 and 158 are commonly coupled to define the output terminal 1510 of the connecting circuit. It is noted that the gate electrodes of drive transistors 157 and 158 are biased by transistors 151 and 156 respectively to provide a large current. Since the voltage at the respective gates of drive transistors 157 and 158 have a value proximate to the threshhold voltage when no signal is being applied at input terminal 159, the drive transistors 157 and 158 are almost turned OFF so that the direct current between the drive transistors 157 and 158 is substantially zero.

Figure 16:
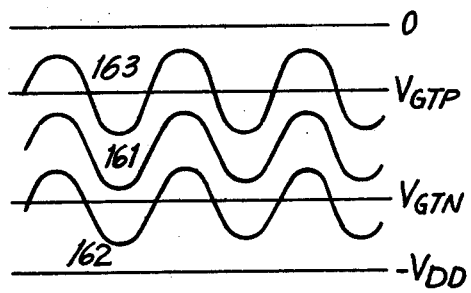
FIG. 16 is a wave diagram illustrating the operation of the C-MOS class B amplifier circuit depcited in FIG. 15.

It is noted that the gate electrode of the transistors 151 and 156 are coupled to the drain terminals thereof and thereby equalize the gate voltage and drain voltage at a value substantially equal to or slightly larger than threshhold voltage. Thus, the pairs of MOSFETs 152 and 153, and 154 and 155 are complementary connected to form resistance loads which divide and apply the input voltage at 159 to drive gates 1511 and 1512 of drive transistors 157 an 158. By equalizing the equivalent resistance provided by MOSFETs 152 an 153 with MOSFETs 151 and 156, the input potential applied at input 159 is readily applied to the gates 1511 and 1512. Accordingly, as illustrated in FIG. 16, the input signal 163 of the P-channel MOSFET is shifted so that the threshhold voltage $V_{GTP}$ is a reference, and the input signal 162 of the N-channel MOSFET is shifted so that the threshhold voltage $V_{GTN}$ is a reference, and the load current $I_D$ alternately flows through the P-channel MOSFET and the N-channel MOSFET during each half cycle so that the current that flows between the transistors 157 and 158 is substantially zero and a minimum current is required to drive the circuit. Accordingly, since it is possible to lower the direct driving current of the earphone loudspeaker to practically zero when no signal is applied, the circuit is particularly suitable for use in a hearing aid.

Figure 17:
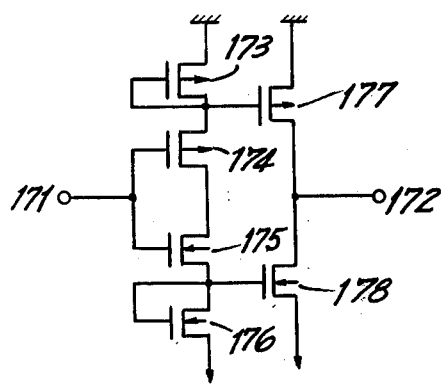
FIG. 17 is a detailed circuit diagram of a further C-MOS class B amplifier circuit constructed in accordance with the instant invention.

As detailed above, an object of this invention is obtained by shifting the voltage bias to a vicinity of the threshhold voltage. This result is also obtained in the connecting circuit illustrated in FIG. 17, wherein the input terminal 171 is defined by the commonly coupled gate terminals of P-channel transistor 174 and N-channel transistor 175 and the gate driving terminals for P-channel drive transistor 177 and N-channel transistor 178 are defined by commonly coupling the gate and drain electrodes of P-channel transistor 173 to the source electrode of P-channel transistor 174 and commonly coupling the gate electrode and drain electrode of N-channel transistor 176 and the drain electrode of N-channel transistor 175 together.

Figure 18:
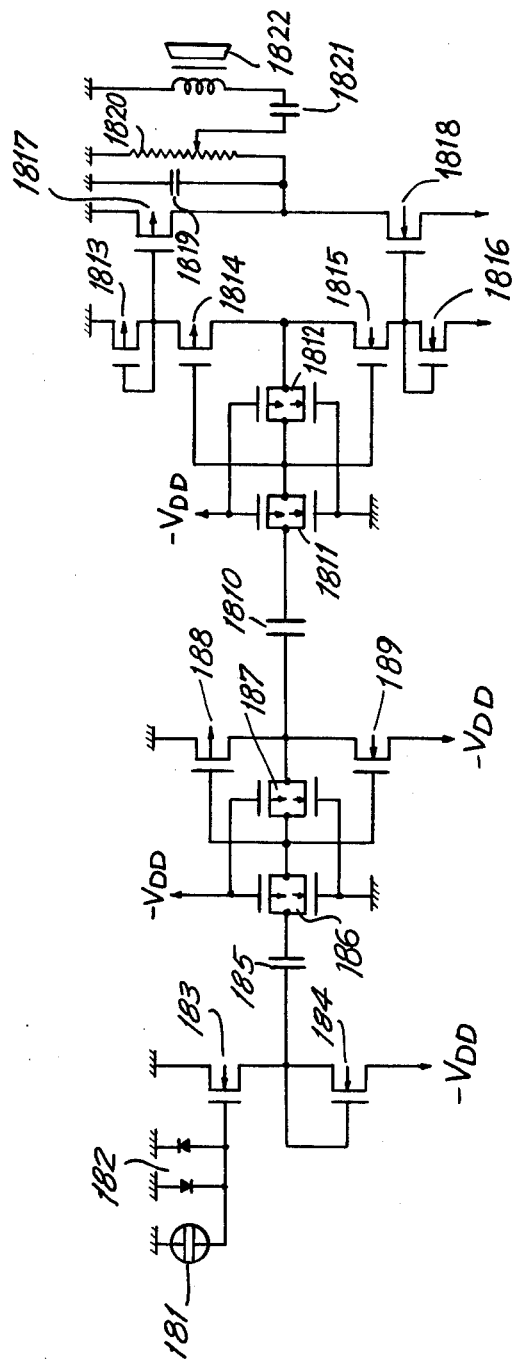
FIG. 18 is a detailed circuit diagram of a hearing aid constructed in accordance with a preferred embodiment of the instant invention.

Reference is now made to FIG. 18, wherein a circuit diagram for a hearing aid utilizing field-effect MOS transistors in accordance with the instant invention is depicted. An ECM input circuit of the type illustrated in FIG. 12 is coupled through a coupling capacitor 185 to a C-MOS inverter-amplifier circuit entirely formed of MOSFETs. The inverter-amplifier circuit is coupled through coupling capacitor 1810 and input resistance 1811 to an earphone driving circuit of the type depicted in FIG. 17, which driving circuit is coupled in parallel with a frequency correction capacitor 1819 and a variable resistor 1820 for controlling the level of the signal applied through coupling capacitor 1821 to earphone 1822.

Specifically, the ECM input circuit includes diode array 182 coupled to the electret capacitor microphone 181 and N-channel transistors 183 and 184 having their respective commonly coupled drain terminals being coupled together to define an output terminal for applying the sound sensed by the ECM through coupling capacitor 185 to the C-MOS inverter-amplifier circuit.

The input resistance of the C-MOS inverter-amplifier is defined by the P-channel and N-channel commonly coupled transistors forming MOS resistor 186. The feedback resistance of the inverter-amplifier is provided by complementary coupled P-channel and N-channel transistors forming MOS resistor 187, which MOS resistor 187 is coupled between the commonly coupled drain and gate terminals of complementary coupled P-channel and N-channel transistors 188 and 189. The output of the inverter-amplifier is coupled through coupling capacitor 1810 to MOS resistor 1811, which resistor defines the input resistance of the class B drive circuit. A further MOS feedback resistor 1812 is coupled intermediate the commonly coupled gate electrodes and drain electrodes of P-channel transistor 1814 and N-channel transistor 1815. P-channel transistor 1814 is coupled in series with P-channel transistor 1813 in order to drive P-channel drive transistor 1819. In like manner, N-channel transistor 1815 is coupled in series with N-channel 1816 to drive N-channel drive transistor 1818 in the same manner described above with respect to FIGS. 15 and 17.

Thus, by providing a frequency correcting capacitor 1819 and a variable resistor for controlling volume of the earphone loudspeaker, a miniaturized hearing aid capable of being driven by a small button-sized silver battery is provided. In the circuit illustrated in FIG. 18, current flow when there is no sound being sensed and, hence, no signals being amplified, is limited to 20µA and only increases to an order to 200MA in a loudspeaker having an input impedence on the order of 1KΩ when the MOSFETs are in a saturation state. Moreover, the gain of the entire circuit is on the order of 70dB when the highest cutoff frequency is 5 KHz (−3dB).

Figure 19:
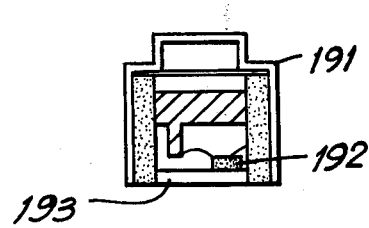
FIG. 19 is a sectional view of an electret capacitor microphone circuit assembly constructed in accordance with the instant invention.

Referring to FIG. 19, a ECM assembly incorporating a MOSFET circuit board is shown. ECM 191 includes an integrated circuit chip 192 and a circuit board 193. Since the integrated circuit chip can be disposed adjacent to the ECM, the connecting cable required in the prior art hearing aid which lessened the reliability of same are eliminated thereby also reducing external noises from being introduced and further increasing the efficiency of the hearing aid.

Figure 20:
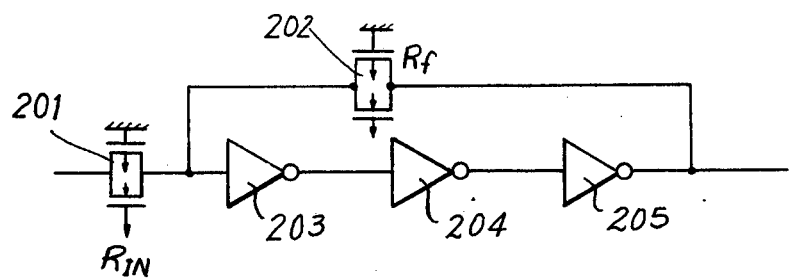
FIGS. 20 and 21 are examples of multi-stage amplifier circuits having complementary coupled MOS transistors forming feedback circuits therefor in accordance with the instant invention.
Figure 21:
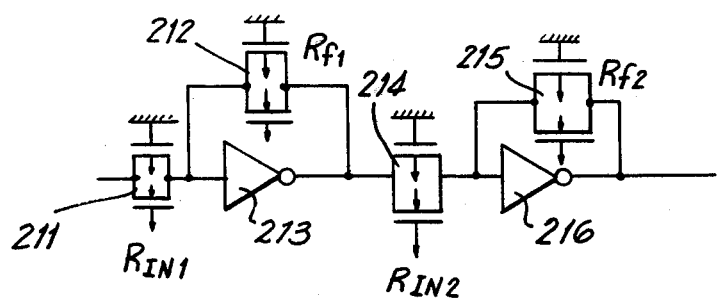

Reference is made to FIG. 20, wherein a C-MOS multistage inverter-amplifier circuit having a MOS feedback resistor is depicted. The respective C-MOS inverters 203, 204 and 205 are series-coupled with the output of inverter-amplifier 205 being fed back through MOS resistor 202 to the input of inverter-amplifier 203. Additionally, an input resistance is formed by a further MOS resistor 201. A further embodiment incorporating a feedback circuit is illustrated in FIG. 21, wherein each stage is defined by the output of the C-MOS inverter circuit being fed back through a MOS resistor to the input of the inverter-amplifier circuit. Accordingly, a first stage defined by COMOS inverter-amplifier 213 includes a MOS feedback resistor 212 and a MOS input resistor 211. The output of the first stage is coupled through a second stage MOS input resistor 214 to the inverter-amplifier 216, wherein the output thereof is fed back to the input through MOS transistor 215.

Accordingly, the instant invention is directed to improving each of the above-noted deficiencies of prior art hearing aids. Specifically, the hearing aid circuitry of the instant invention can be driven by a button-type silver battery or a regular silver battery with a minimum of power consumption. Also, the circuit requires minimal power to be effectively energized and the circuit is sufficiently miniatruized to provide a small-sized hearing aid. Moreover, inverters utilizing enhancement-type MOSFETs having a threshhold voltage of about 0.5V have a high gain at about 1.5V and are comprised of a small number of circuit elements. Also, current consumption in the amplifier circuit is maintained within a range of several to ten µA to several MA by utilizing C-MOS transistors. Additionally, by utilizing a class B operation mode amplification circuit and earphone drive circuit, the battery life can be extended from five to twenty times the life of a silver battery producing a 100 mAH output.

Moreover, it is further noted that since each of the circuit elements are MOSFETs, they can be formed on a single integrated circuit chip, thereby further reducing the size of the hearing aid. Finally, the small size of the integrated circuit chip permits each of the circuits to be included in the microphone so that it is possible to obtain a unitary microphone and earphone construction thereby further reducing the cost and increasing the reliability thereof.

Finally, the advantages which inure to the instant invention such as the greater miniaturization and reduced power consumption render a hearing aid in accordance with the instant invention to be particularly suited for use in behind-the-ear hearing aids, ear-plug type hearing aids, and eyeglass temple hearing aids in addition to the box-type hearing aid most frequently utilized.

It will thus be seen that the objects set forth above, among those made apparent from the preceding description, are efficeintly attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In a hearing aid including first transducer means for producing a signal representative of sound, amplifier means for producing an amplified signal in response to said signal produced by said first transducer means and second transducer means for producing sound representative of the sound sensed by said first transducer means at an amplified level, the improvement comprising said amplifier means being formed of at least one first pair of complementary coupled P-channel and N-channel MOS field-effect transistors, the respective gate electrodes and drain electrodes of said pair of P-channel and N-channel transistors being commonly coupled to respectively define an input of said amplifier and an output of said amplifier, a first input impedance means coupled intermediate said first transducer means and said gate input of said amplifier means, and first feedback impedance means for feeding back said drain output of said amplifier means to said gate input of said amplifier means to provide a closed loop gain proportional to the ratio of said second impedance means to said first impedance means.

2. A hearing aid as claimed in claim 1, and including second feedback impedance means defined by a second pair of P-channel and N-channel transistor means having the respective drain electrodes thereof commonly coupled to the drain output defined by said first pair of P-channel and N-channel transistors to thereby define said second feedback impedance means.

3. A hearing aid as claimed in claim 1, wherein said first input impedance means and said first feedback impedance means are defined by complementary coupled pairs of P-channel and N-channel MOS field-effect transistors having their respective pairs of source electrodes and drain electrodes coupled together to define a first fixed input resistance and first fixed feedback resistance.

4. A hearing air as claimed in claim 3, wherein the specific value of resistance of said first input resistance and first feedback resistance is determined by the size-ratio of the channel of the respective P-channel and N-channel pairs of transistors defining said respective resistances.

5. A hearing aid as claimed in claim 1, and including a plurality of amplifier stages, each said amplifier stage being defined by said pair of complementary coupled P-channel and N-channel field-effect transistors, first input impedance means and first feedback impedance means.

6. A hearing aid as claimed in claim 1, and including second feedback impedance means characterized by a second P-channel transistor and N-channel transistor respectively coupled to said first P-channel and N-channel transistors defining said amplifier circuit means, said respective source and drain electrodes of said first and second P-channel transistors and said first and second N-channel transistors being commonly coupled, and said gate electrodes of said second P-channel and N-channel transistors being coupled to said drain output defined by said first P-channel and N-channel transistors.

7. A hearing aid as claimed in claim 1, and including second feedback impedance means defined by a second pair of P-channel and N-channel MOS field-effect transistors, said second P-channel transistors and first N-channel transistors having its source-drain path coupled in series with the source-drain path of said first P-channel transistor, and said second N-channel transistor having its source-drain path coupled in series with the source-drain path of said first N-channel transistor, the gate electrodes of said second path of P-channel and N-channel transistors being commonly coupled to the drain output defined by said first pair of P-channel and N-channel transistors.

8. In a hearing aid including first transducer means for producing a signal representative of sound, amplifier means for amplifying the signal produced by said first transducer means and second transducer means for producing sounds representative of the sound sensed by said first transducer means at an amplified level in response to said amplified signal produced by said amplifier means, the improvement comprising said first transducer means including microphone means for producing sound signals in response to the sound sensed thereby and microphone input circuit means coupled to said microphone means for applying signals representative of the sound sensed by said microphone means to said amplifier means, said microphone input circuit means including at least one pair of MOS field-effect transistors having a commonly coupled drain terminal defining an output to be coupled to said amplifier means, and a gate electrode of one of said transistors being coupled to said microphone means to receive said sound signals therefrom in response to the sound sensed thereby the gate electrode of said MOS transistor not coupled to said microphone means being coupled to the commonly coupled drain output of the microphone input circuit means to thereby stabilize the operation thereof, a further microphone means for producing a sound signal representative of the sound sensed thereby, and additional input circuit means for receiving said sound signals produced by said further microphone means, said additional input circuit means including a second pair of MOS transistors, said first and second pairs of transistors having their respective gate electrodes coupled together to define first and second inputs to be respectively coupled to said first mentioned microphone means and further microphone means to receive the sound signal produced thereby, the drain terminal of each of said transistors in said first and second pairs of transistors being coupled together to define an output to be coupled to said amplifier means for producing a signal representative of the sound sensed by said first mentioned microphone means and said additional microphone means.

9. In a hearing aid including first transducer means for producing a signal representative of sound, amplifier means for amplifying the signal produced by said first transducer means and second transducer means for producing sounds representative of the sound sensed by said first transducer means at an amplified level in response to said amplified signal produced by said amplifier means, the improvement comprising said first transducer means including microphone means for producing sound signals in response to the sound sensed thereby and microphone input circuit means coupled to said microphone means for applying signals representative of the sound sensed by said microphone means to said amplifier means, said microphone input circuit means including at least one pair of MOS field-effect transistors having a commonly coupled drain terminal defining an output to be coupled to said amplifier means, and a gate electrode of one of said transistors being coupled to said microphone means to receive said sound signals therefrom in response to the sound sensed thereby the gate electrode of said MOS transistor not coupled to said microphone means being coupled to the commonly coupled drain output of the microphone input circuit means to thereby stabilize the operation thereof.

10. A hearing aid as claimed in claim 9, wherein said microphone means is an electret capacitor microphone.

11. A hearing aid as claimed in claim 9, and including diode limiting means coupled intermediate said microphone means and said gate means adapted to receive said sound signal from said microphone means in order to limit the voltage applied to said gate electrode.

12. A hearing aid as claimed in claim 9, wherein said pair of MOS transistors are a P-channel transistor and an N-channel transistor.

13. A hearing aid as claimed in claim 9, wherein said pair of MOS transistors are both P-channel transistors.

14. A hearing aid as claimed in claim 9, wherein said pair of MOS transistors are both N-channel transistors.

15. In a hearing aid including first microphone means for producing signals representative of sound sensed thereby and earphone means for reproducing sound sensed by said microphone means at an amplified level, the improvement comprising microphone circuit means for transmitting the signals representative of sound produced by said microphone means, amplifier means coupled to said microphone circuit means for amplifying the signals representative of sound transmitted thereto by said microphone circuit means, and earphone amplifier-drive circuit means for receiving said amplifier signal produced by said amplifier means and in response thereto being adapted to apply drive signals to said earphone means to drive same, said microphone circuit means, amplifier means and drive circuit means each including at least one pair of MOS field-effect transistor means having commonly coupled drain electrodes defining the output thereof.

16. A hearing aid as claimed in claim 15, wherein said pair of MOS field-effect transistor means of said amplifier means is defined by complementary coupled P-channel and N-channel MOS field-effect transistors, the respective gate electrodes and drain electrodes of said pair of P-channel and N-channel transistors being commonly coupled to respectively define an input of said amplifier means and an output of said amplifier means.

17. A hearing aid as claimed in claim 15, wherein said pair of MOS field-effect transistor means includes a first gate electrode of one of said transistor means being coupled to said microphone to receive said sound signals therefrom in response to the sound sensed thereby.

18. A hearing aid as claimed in claim 15, wherein said one pair of MOS field-effect transistor means forming said amplifier-drive circuit means includes a first P-channel field-effect MOS drive transistor with the respective drain electrodes coupled together to define a drive output for applying a drive signal to said earphone means to drive same.

19. A hearing aid including first transistor means for producing a signal representative of sound, amplifier means for producing an amplified signal in response to the signal produced by said first transducer means, and second transducer means for producing sounds representative of the sound sensed by said first transducer means at an amplified level in response to said amplified signal produced by said amplifier means, the improvement comprising said second transducer means including earphone means for producing sound in response to a driving signal applied thereto, and amplifier-drive circuit means coupled to said amplifier means for receiving said amplified signal produced thereby and applying an amplified drive signal to said earphone means, said amplifier-drive circuit means including a first P-channel field-effect MOS drive transistor and a second N-channel MOS field-effect drive transistor having commonly coupled drain electrodes for defining a drive output for applying a drive signal to said earphone means, and including at least one pair of coupled first MOS transistor means defining an input for said amplifier-drive circuit means for receiving the amplified signal produced by said amplifier means, and a second P-channel transistor coupled in series with one of said first MOS transistor means, the junction between said second P-channel MOS transistor means and said first-transistor means of said pair being coupled to said P-channel drive transistor means, and a second N-channel transistor means coupled to the other first transistor means of said pair of transistor means defining said input, the junction therebetween being coupled to the gate electrode of said N-channel drive transistor.

20. A hearing aid as claimed in claim 19, wherein said pair of first MOS transistor means defining said input are complementary coupled third P-channel and N-channel transistors having their gate electrodes coupled in common to define said input and having the source electrodes of said respective third P-channel and N-channel transistors coupled to the drain electrodes of said second P-channel and N-channel transistors.

21. A hearing aid as claimed in claim 20, wherein said first MOS transistor means includes a first pair of complementary coupled like-channel MOS transistors having their respective source electrodes and drain electrodes coupled together and a second pair of like-channel MOS field-effect transistors having their respective source and drain electrodes commonly coupled, the junction between said first pair and second pair of complementary coupled pairs of like-channel MOS field-effect transistors defining an input to the amplifier-drive circuit means, the remaining coupled electrodes being coupled to the drive electrodes of said first P-channel drive transistor and N-channel transistor respectively.

22. In a hearing aid including first transducer means for producing a signal representative of sound, amplifier means for amplifying the signal produced by said first transducer means and second transducer means for producing sounds representative of the sound sensed by said first transducer means at an amplified level in response to said amplified signal produced by said amplifier means, the improvement comprising said first transducer means including microphone means for producing sound signals in response to the sound sensed thereby and microphone input circuit means coupled to said microphone means for applying signals representative of the sound sensed by said microphone means to said amplified means, said microphone input circuit means including at least one pair of MOS field-effect transistors having a commonly coupled drain terminal defining an output to be coupled to said amplifier means, and a gate electrode of one of said transistors being coupled to said microphone means to receive said sound signals therefrom in response to the sound sensed thereby, the gate electrode of said MOS transistor not coupled to said microphone means being coupled to the commonly coupled drain output of the microphone input circuit means to thereby stabilize the operation thereof, a further microphone means for producing a sound singal representative of the sound sensed thereby, said input circuit means including a second pair of MOS transistors having commonly coupled gate electrodes adapted to be coupled to said further microphone means to receive the sound signal produced thereby, the respective gate electrodes of said first pair of MOS field-effect transistors being coupled together and adapted to receive the sound signal produced by said first-mentioned microphone means, said first and second transistors of said second pair being respectively coupled in series to said first and second MOS transistors of said first pair so that the drain outputs of said first pair of MOS field-effect transistors define an output of the microphone input circuit means for producing a signal representatve of the sound sensed by said first-mentioned microphone means and said further microphone means.

* * * * *